United States Patent
Kung et al.

(10) Patent No.: US 12,279,360 B2
(45) Date of Patent: Apr. 15, 2025

(54) OPTICAL TRANSCEIVER INCLUDING HEAT DISSIPATION COMPONENTS THERMALLY COUPLED TO OPPOSITE SIDES OF HOUSING

(71) Applicant: Prime World International Holdings Ltd., New Taipei (TW)

(72) Inventors: Ling-An Kung, New Taipei (TW); Yu Chen, New Taipei (TW); Che-Shou Yeh, New Taipei (TW)

(73) Assignee: Prime World International Holdings Ltd., New Taipei (TW)

( * ) Notice: Subject to any disclaimer, the term of this patent is extended or adjusted under 35 U.S.C. 154(b) by 203 days.

(21) Appl. No.: 17/954,146

(22) Filed: Sep. 27, 2022

(65) Prior Publication Data
US 2024/0107655 A1 Mar. 28, 2024

(51) Int. Cl.
*H05K 1/02* (2006.01)
*G02B 6/42* (2006.01)
*H05K 5/00* (2006.01)
*H05K 7/20* (2006.01)

(52) U.S. Cl.
CPC ......... *H05K 1/0203* (2013.01); *G02B 6/4268* (2013.01); *H05K 5/0047* (2013.01); *H05K 7/2039* (2013.01); *H05K 7/20445* (2013.01)

(58) Field of Classification Search
CPC . H05K 1/0203; H05K 7/20436–20445; G02B 6/4268
See application file for complete search history.

(56) References Cited

U.S. PATENT DOCUMENTS

| | | | |
|---|---|---|---|
| 5,812,375 A * | 9/1998 | Casperson | H05K 1/0204 361/720 |
| 6,180,436 B1 * | 1/2001 | Koors | H01L 23/3675 438/117 |
| 6,365,964 B1 * | 4/2002 | Koors | H05K 7/20436 257/713 |
| 6,821,816 B1 * | 11/2004 | Lawlyes | H01L 23/433 257/E23.09 |
| 6,873,043 B2 * | 3/2005 | Oman | H01L 24/73 257/E23.09 |
| 6,998,706 B2 * | 2/2006 | Lawlyes | H01L 23/433 257/E23.09 |

(Continued)

*Primary Examiner* — Robert J Hoffberg
(74) *Attorney, Agent, or Firm* — Grossman Tucker Perreault & Pfleger, PLLC

(57) ABSTRACT

An optical transceiver includes housing, circuit board, first heat source, second heat source, first heat conductive component and second heat conductive component. The housing includes a first housing and a second housing that are stacked on each other and together form an accommodation space. The circuit board is disposed in the accommodation space. The first heat source and the second heat source are disposed on and electrically connected to the circuit board. The first heat conductive component is disposed in the circuit board and thermally coupled to the first housing. A part of the circuit board is located between the first heat conductive component and the first heat source. The second heat conductive component is disposed on the circuit board. The second heat source is thermally coupled to the second heat conductive component. The second heat conductive component is thermally coupled to the second housing.

13 Claims, 4 Drawing Sheets

(56) References Cited

U.S. PATENT DOCUMENTS

| | | | | |
|---|---|---|---|---|
| 7,023,699 B2* | 4/2006 | Glovatsky | ......... | H05K 7/20454 |
| | | | | 361/708 |
| 7,064,963 B2* | 6/2006 | Oman | ................... | H01L 25/162 |
| | | | | 428/209 |
| 7,561,436 B2* | 7/2009 | Brandenburg | ...... | H01L 23/3677 |
| | | | | 257/718 |
| 7,780,469 B2* | 8/2010 | Zschieschang | ........ | H05K 3/303 |
| | | | | 361/709 |
| 8,243,454 B2* | 8/2012 | Oota | ................. | H05K 7/20454 |
| | | | | 165/80.3 |
| 8,270,170 B2* | 9/2012 | Hughes | ............... | H05K 7/2049 |
| | | | | 361/679.52 |
| 9,320,178 B2* | 4/2016 | Oota | ................... | H05K 7/20854 |
| 9,564,417 B2* | 2/2017 | Byun | .................. | H01L 25/0652 |
| 12,108,518 B2* | 10/2024 | Kung | .................. | G02B 6/4204 |
| 2003/0161592 A1* | 8/2003 | Wolf | .................. | H01S 5/06804 |
| | | | | 385/92 |
| 2016/0025430 A1* | 1/2016 | Dede | .................... | H01L 23/373 |
| | | | | 165/185 |
| 2022/0075133 A1* | 3/2022 | Lin | ....................... | G02B 6/4272 |
| 2022/0221667 A1* | 7/2022 | Yao | ....................... | G02B 6/4269 |
| 2022/0248561 A1* | 8/2022 | Mao | .................... | H05K 7/20445 |

* cited by examiner

OPTICAL TRANSCEIVER INCLUDING HEAT DISSIPATION COMPONENTS THERMALLY COUPLED TO OPPOSITE SIDES OF HOUSING

BACKGROUND

1. Technical Field

The present disclosure relates to optical communication, more particularly to an optical transceiver.

2. Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), and others at different communication rates have been made available.

At present, heat dissipation of an optical communication module in the optical transceiver is primarily facilitated by an optical transceiver housing which further transfers heat to fins on the cage. Therefore, a proper heat dissipation path is needed inside the optical transceiver in order to quickly transfer the heat generated by optical or electronic components to the housing.

SUMMARY

According to one aspect of the present disclosure, an optical transceiver includes a housing, a circuit board, a first heat source, a second heat source, a first heat conductive component and a second heat conductive component. The housing includes a first housing and a second housing that are stacked on each other and together form an accommodation space. The circuit board is disposed in the accommodation space. The first heat source and the second heat source are disposed on and electrically connected to the circuit board. The first heat conductive component is disposed in the circuit board and thermally coupled to the first housing. A part of the circuit board is located between the first heat conductive component and the first heat source. The second heat conductive component is disposed on the circuit board. The second heat source is thermally coupled to the second heat conductive component. The second heat conductive component is thermally coupled to the second housing.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
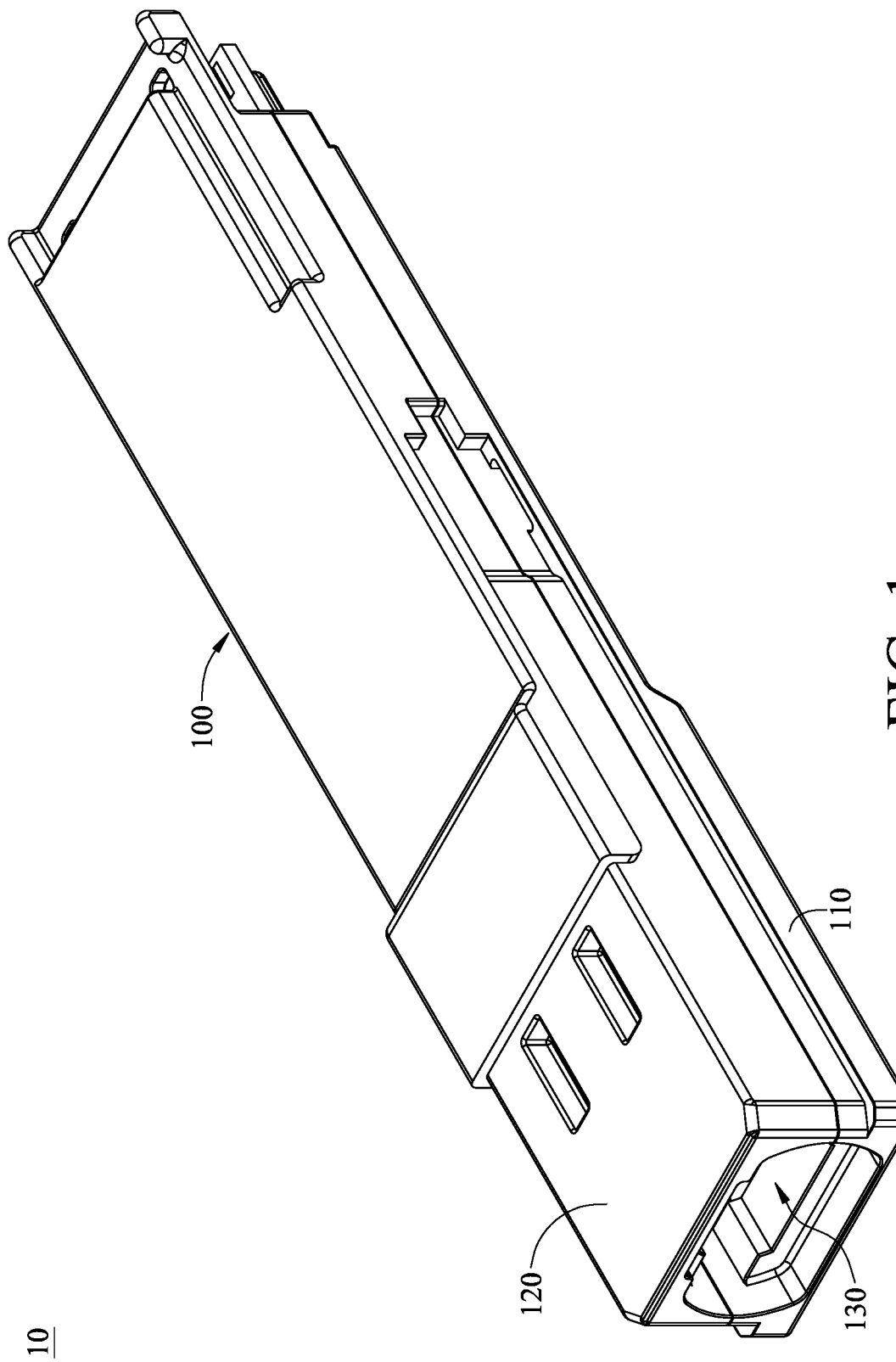
FIG. 1 is a perspective view of an optical transceiver according to one embodiment of the present disclosure.
Figure 2:
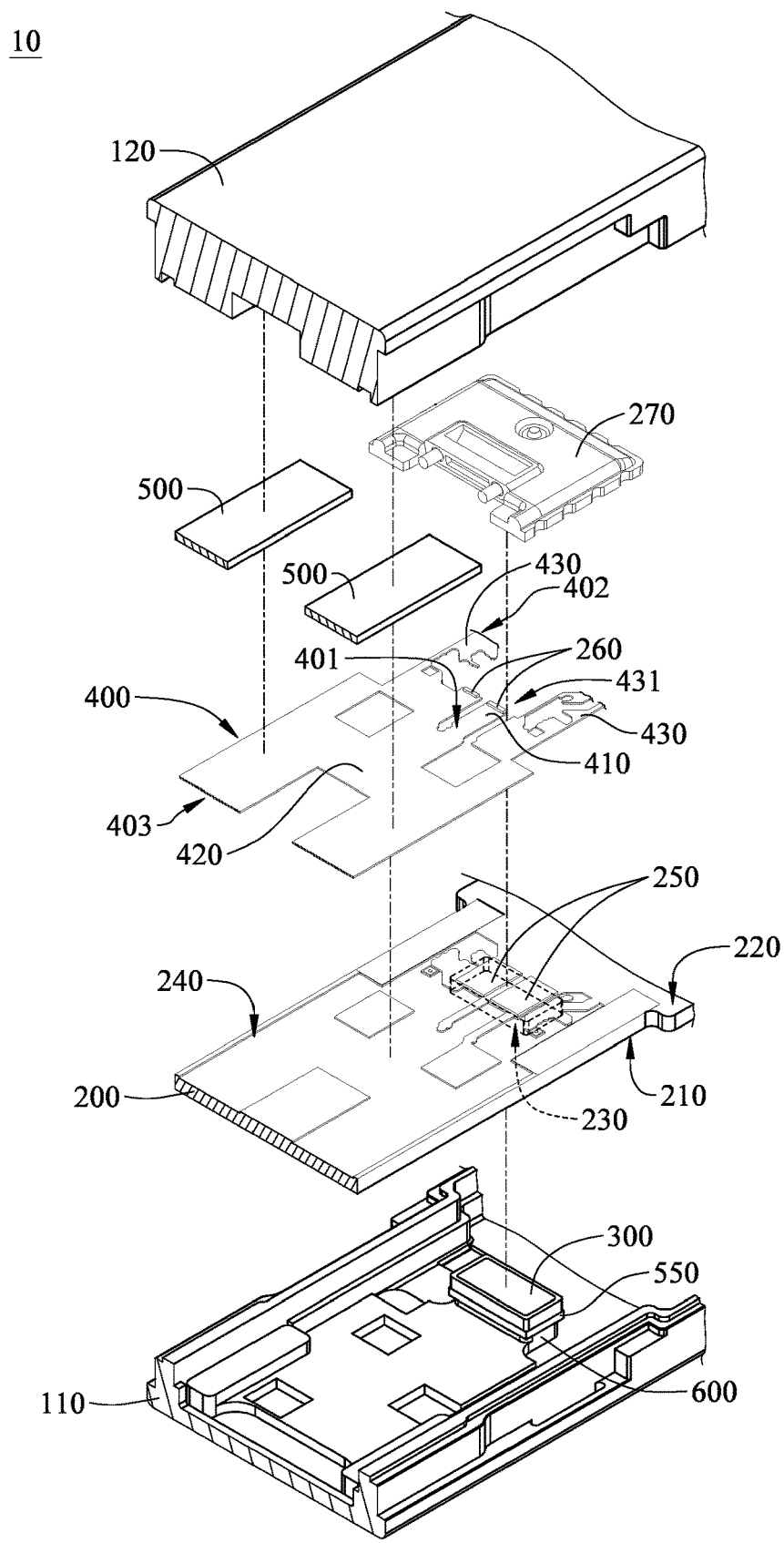
FIG. 2 is an exploded view of the optical transceiver in FIG. 1.

Please refer to FIGS. 1 and 2. FIG. 1 is a perspective view of an optical transceiver according to one embodiment of the present disclosure. FIG. 2 is an exploded view of the optical transceiver in FIG. 1. In this embodiment, an optical transceiver 10 may include a housing 100, a circuit board 200, two first heat sources 250, two second heat sources 260, a lens assembly 270, a first heat conductive component 300, a second heat conductive component 400, and two thermal pads 500.

The housing 100 may include a first housing 110 and a second housing 120. The first housing 110 and the second housing 120 may be stacked on each other. The first housing 110 and the second housing 120 may together form an accommodation space 130.

The circuit board 200 may be disposed in the accommodation space 130. In this embodiment, the circuit board 200 may have a first surface 210, a second surface 220, a first recess 230 and a second recess 240. The first surface 210 and the second surface 220 may face away from each other. The first surface 210 may face the first housing 110. The second surface 220 may face the second housing 120. The first recess 230 may be recessed from the first surface 210. The second recess 240 may be recessed from the second surface 220.

The first heat source 250 and the second heat source 260 that are located adjacent to each other may be similar in structure and arrangement, with that particular first heat source 250 and second heat source 260 might be paired together. Thus, hereinafter, only one pair of one first heat source 250 and one second heat source 260 that are located adjacent to each other may be described in detail. Note that the present disclosure is not limited to the number of the first heat sources 250 and the number of the second heat sources 260.

The first heat source 250 and the second heat source 260 may be disposed on the second surface 220 of the circuit board 200. The first heat source 250 and the second heat source 260 may be electrically connected to the circuit board 200. The first heat source 250 may be a light engine. The second heat source 260 may be a laser. With the above arrangement, the heat generated by the second heat source 260 may be larger than the heat generated by the first heat source 250. The lens assembly 270 may be disposed on the second surface 220 of the circuit board 200, and may cover the first heat source 250 and the second heat source 260.

Figure 3:
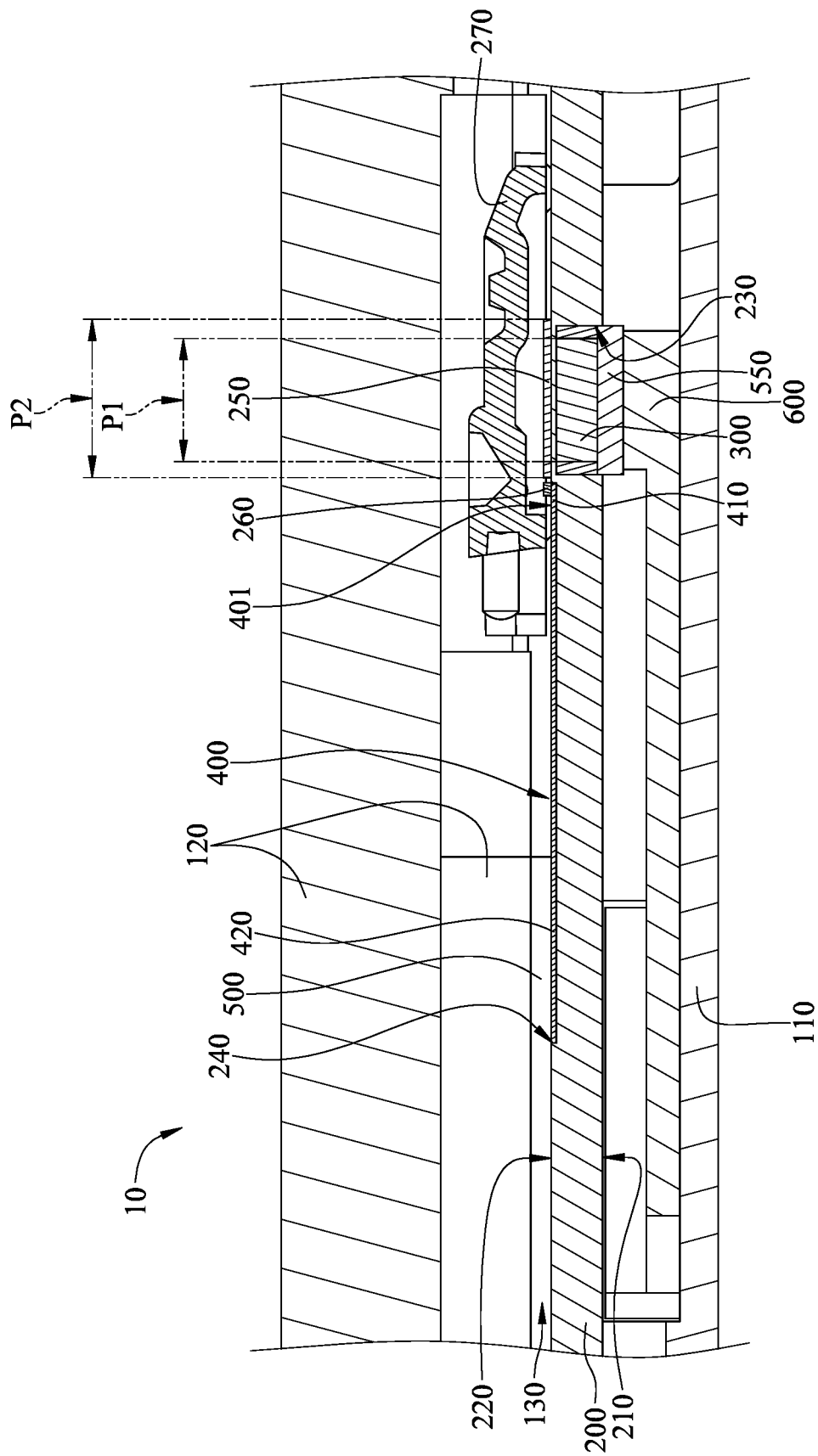
FIG. 3 is a cross-sectional view of the optical transceiver in FIG. 1.
Figure 4:
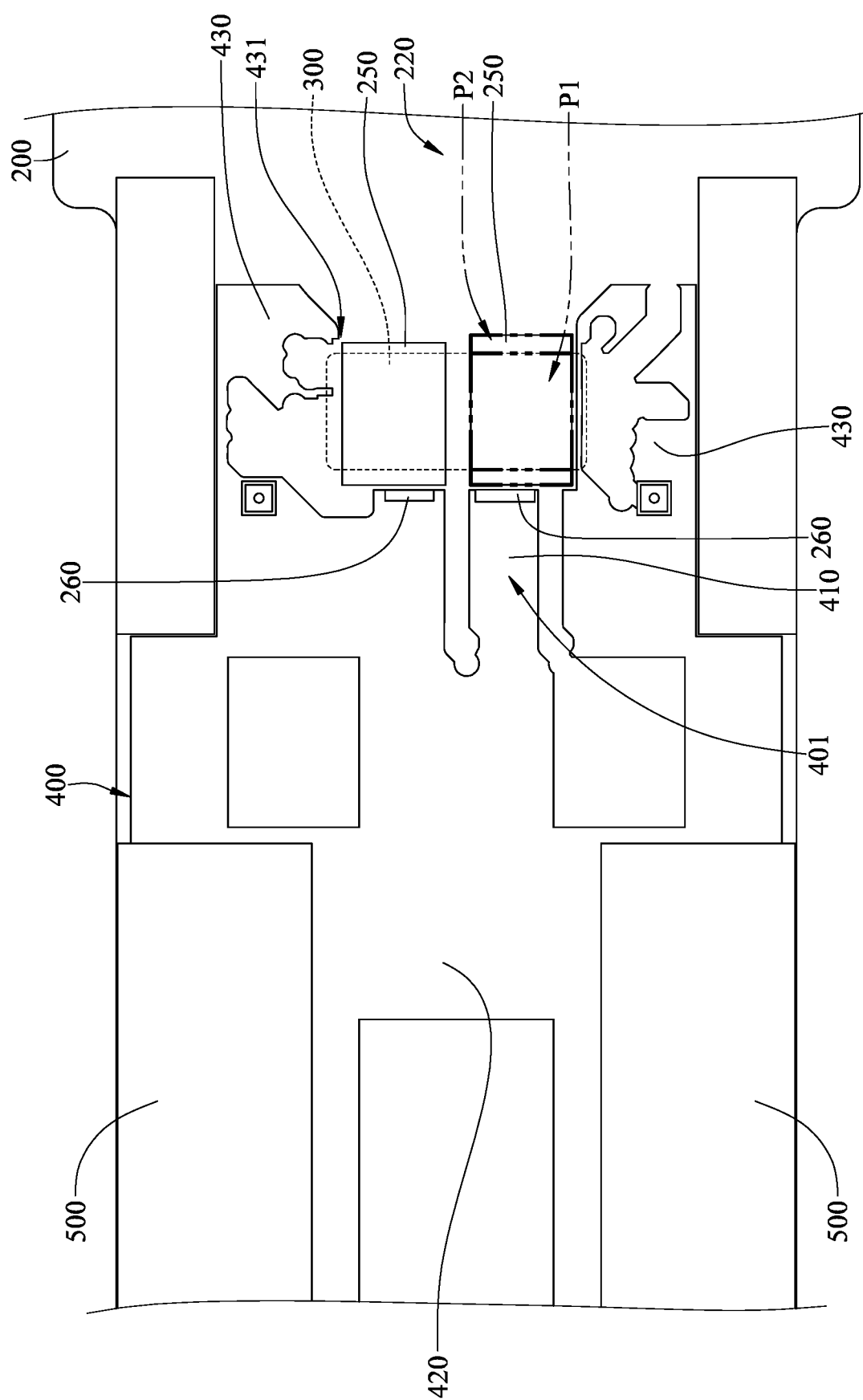
FIG. 4 is a top view of the optical transceiver in FIG. 1 omitting a second housing and a lens assembly.

Please refer to FIGS. 2 through 4. FIG. 3 is a cross-sectional view of the optical transceiver in FIG. 1. FIG. 4 is a top view of the optical transceiver in FIG. 1 omitting both the second housing and the lens assembly.

The first heat conductive component 300 may be disposed in the circuit board 200 and may be thermally coupled to the first housing 110. A part of the circuit board 200 may be located between the first heat conductive component 300 and the first heat source 250. In this embodiment, the first heat conductive component 300 may be a copper block. The first heat conductive component 300 may be located in the first recess 230. In this embodiment, as shown in FIGS. 3 and 4, projection P1 of a part of the first heat conductive component 300 overlapped with the first heat source 250 onto the second surface 220 may be less than projection P2 of the first heat source 250 onto the second surface 220 along a predetermined direction. In other words, the part of the first conductive component 300 overlapped with the first heat source 250 might be smaller than the first heat source 250 along the same direction, despite the part of the first conductive component 300 overlapped with the first heat source 250 might be larger than the first heat source 250 in size.

Note that in this embodiment, the optical transceiver 10 may further include a thermal pad 550 and a heat conductive plate 600. The heat conductive plate 600 may be in thermal contact with the first housing 110. The thermal pad 550 may be clamped between the first heat conductive component 300 and the heat conductive plate 600. Thus, the first heat conductive component 300 may be thermally coupled to the first housing 110 via the thermal pad 550 and the first heat conductive component 300. In other embodiments, the optical transceiver may not include the thermal pad 550 and the first heat conductive component 300.

In this embodiment, the second heat conductive component 400 may be a metal layer. The second heat conductive component 400 may be disposed on the circuit board 200. The second heat source 260 may be thermally coupled to the second heat conductive component 400. The second heat conductive component 400 may be thermally coupled to the second housing 120. In this embodiment, the second heat conductive component 400 may be in thermal contact with (i.e., be in thermally coupled to and in contact with) the second heat source 260. The second heat conductive component 400 may be located in the second recess 240. The second heat conductive component 400 may have a mounting surface 401. The mounting surface 401 may face away from the first surface 210. The second heat source 260 may be located on the mounting surface 401. In this embodiment, as shown in FIG. 3, the mounting surface 401 of the second heat conductive component 400 may be flush with the second surface 220 of the circuit board 200.

In other embodiments, the circuit board may not have the second recess 240 so that the second heat conductive component may be disposed on the second surface of the circuit board. In such embodiments, the mounting surface of the second heat conductive component may not be flush with the second surface of the circuit board.

In this embodiment, the second heat conductive component 400 may include a mounting part 410, a first extending part 420 and two second extending parts 430 (shown in FIG. 4). In this embodiment, the second heat conductive component 400 may have a hot side 402 and a cold side 403 that are located opposite to each other. The mounting surface 401 may be located at the mounting part 410, and the mounting part 410 may be located on the hot side 402. That is, the second heat source 260 disposed on the mounting surface 401 may be located on the hot side 402. The first extending part 420 may extend from a side of the mounting part 410 that is located farthest away from the first heat source 250. The first extending part 420 may be located on the cold side 403. That is, the cold side 403 may be located on a side of the second heat source 260 that is located farthest away from the first heat source 250. The two second extending parts 430 may extend from a side of the first extending part 420 that is located closest to the first heat source 250. The two second extending parts 430 may be located on the hot side 402. A through hole 431 may be formed between the two second extending parts 430. The first heat source 250 may be located in the through hole 431. In this embodiment, as shown in FIGS. 3 and 4, the second heat conductive component 400 may not be located between the first heat source 250 and the first heat conductive component 300. Thus, the heat transfer between the first heat source 250 and the first heat conductive component 300 might not interfere with the heat transfer between the second heat source 260 and the second heat conductive component 400.

In this embodiment, the first heat conductive component 300 and the second heat conductive component 400 may be made from different materials. Specifically, in this embodiment, heat expansion coefficient of the second heat conductive component 400 may be smaller than heat expansion coefficient of the first heat conductive component 300. More specifically, the first heat conductive component 300 may be made of copper, and the second heat conductive component 400 may be made of copper-tungsten. The heat expansion coefficient of the second heat conductive component 400 may be smaller than that of the first heat conductive component 300, and the second heat source 260 may generate more heat than the first heat source 250. Thus, the deformation of the second heat conductive component 400 caused by a large amount of heat generated by the second heat source 260 may be reduced, thereby enhancing the reliability of the second heat conductive component 400.

In other embodiments, the amount of heat generated by the second heat source may be smaller than or equal to the amount of heat generated by the first heat source. In such embodiments, the heat expansion coefficient of the second heat conductive component may be smaller than or equal to the heat expansion coefficient of the first heat conductive component, and the first heat conductive component and the second heat conductive component may be made from the same material.

In this embodiment, the two thermal pads 500 may be disposed between the first extending part 420 of the second heat conductive component 400 and the second housing 120. Further, in this embodiment, the two thermal pads 500 may be clamped between the first extending part 420 of the second heat conductive component 400 and the second housing 120. That is, the cold side 403 located on the first extending part 420 may be thermally coupled to the second housing 120 via the two thermal pads 500. In other embodiments, the optical transceiver may include one thermal pad. In other embodiments, the optical transceiver may not include the thermal pads 500, and the first extending part may be in thermal contact with the second housing without both the first extending part and the second housing sandwiching the thermal pads.

According to the optical transceiver disclosed by the above embodiments, the first heat conductive component and the second heat conductive component may be thermally coupled to the first housing and the second housing that are stacked on each other, respectively. In addition, a part of the circuit board may be located between the first heat conductive component and the first heat source, and the second heat source may be thermally coupled to the second heat conductive component. Thus, a heat dissipation path along which the heat generated by the first heat source is transferred to the first heat conductive component may be separated from a heat dissipation path along which the heat generated by the second heat source is transferred to the first heat conductive component.

In this way, comparing to the conventional optical transceiver that uses the same heat dissipation path to dissipate the heat generated by two or more heat sources, the heat generated by the first heat source and the second heat source may be more efficiently dissipated to the outside of the housing with the help of the first heat conductive component and the second heat conductive component. Specifically, according to experiment result the temperature of the second heat source may be reduced from 76.18° C. to 73.25° C.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. An optical transceiver, comprising:
   a housing, comprising a first housing and a second housing together forming an accommodation space;
   a circuit board, disposed in the accommodation space, wherein the circuit board has:
     a first surface at the first side, the first surface faces the first housing,
     a second surface at the second side and faces opposite to the first surface, the second surface faces the second housing,
     a first recess, the first recess is recessed from the first surface of the circuit board, and
     a second recess, the second recess is recessed from the second surface of the circuit board;
   a first heat source located on the second surface of the circuit board and electrically connected to the circuit board;
   a second heat source, the second heat source disposed on and electrically connected to the circuit board;
   a first heat conductive component located in the first recess, wherein the first heat conductive component is disposed on the circuit board, the first heat conductive component is at a first side of the circuit board toward the first housing and thermally coupled to the first housing, and a part of the circuit board is located between the first heat conductive component and the first heat source; and
   a second heat conductive component located in the second recess, wherein the second heat conductive component is disposed on the circuit board and in physical contact with the second heat source, the second heat source is thermally coupled to the second heat conductive component, and the second heat conductive component is at a second side of the circuit board toward the second housing and is thermally coupled to the second housing, wherein the second heat conductive component has a mounting surface, the mounting surface faces away from the first surface, and the second heat source is located on the mounting surface;
   wherein an entirety of the first heat conductive component is separated from an entirety of the second heat conductive component by the circuit board.

2. The optical transceiver according to claim 1, wherein the mounting surface of the second heat conductive component is flush with the second surface of the circuit board.

3. The optical transceiver according to claim 1, wherein a projection of a part of the first heat conductive component overlapped with the first heat source onto the second surface is less than a projection of the first heat source onto the second surface, the second heat conductive component has a hot side and a cold side that are located opposite to each other, the second heat source and the mounting surface are located on the hot side, the cold side is thermally coupled to the second housing, and the cold side is located on a side of the second heat source that is located farthest away from the first heat source.

4. The optical transceiver according to claim 3, wherein the second heat conductive component is a metal layer.

5. The optical transceiver according to claim 4, wherein the second heat conductive component comprises a mounting part, a first extending part and two second extending parts, the mounting surface is located at the mounting part, the first extending part extends from a side of the mounting part that is located farthest away from the first heat source, the two second extending parts extend from a side of the first extending part that is located closest to the first heat source, the mounting part and the two second extending parts are located on the hot side of the second heat conductive component, the first extending part is located on the cold side of the second heat conductive component, a through hole is formed between the two second extending parts, and the first heat source is located in the through hole.

6. The optical transceiver according to claim 5, further comprising a thermal pad, wherein the thermal pad is clamped between the first extending part of the second heat conductive component and the second housing.

7. The optical transceiver according to claim 1, wherein an amount of a heat generated by the second heat source is larger than an amount of a heat generated by the first heat source.

8. The optical transceiver according to claim 7, wherein the first heat conductive component and the second heat conductive component are made from different materials.

9. The optical transceiver according to claim 8, wherein a heat expansion coefficient of the second heat conductive component is smaller than a heat expansion coefficient of the first heat conductive component.

10. The optical transceiver according to claim 1, wherein the second heat conductive component is not located between the first heat source and the first heat conductive component.

11. The optical transceiver according to claim 1, wherein the first heat conductive component is a copper block.

12. The optical transceiver according to claim 1, wherein the first heat conductive component provides a first heat dissipation path from the first heat source to the first housing, the second heat conductive component provides a second heat dissipation path from the second heat source to the second housing, and the first heat dissipation path is separated from the second heat dissipation path.

13. The optical transceiver according to claim 1, wherein the first heat source is a light engine, and the second heat source is a laser.

* * * * *